United States Patent [19]

Schwartz, deceased

[11] Patent Number: 4,520,459
[45] Date of Patent: May 28, 1985

[54] BUBBLE MEMORY WHICH TRANSFERS BUBBLES IN BOTH RIGHT-TO-LEFT AND LEFT-TO-RIGHT SPS LOOPS TO PROVIDE A SHORT ACCESS TIME

[75] Inventor: Sidney J. Schwartz, deceased, late of Vista, Calif., by Marie A. Schwartz, executrix

[73] Assignee: Burroughs Corporation, Detroit, Mich.

[21] Appl. No.: 508,945

[22] Filed: Jun. 29, 1983

[51] Int. Cl.³ .............................................. G11C 19/08
[52] U.S. Cl. ....................................................... 365/15
[58] Field of Search ...................................... 365/15, 16

[56] References Cited

U.S. PATENT DOCUMENTS 4,176,404 11/1979 Dimyar et al. ......................... 365/15

FOREIGN PATENT DOCUMENTS 38653 3/1980 Japan ..................................... 365/15

*Primary Examiner*—James W. Moffitt
*Attorney, Agent, or Firm*—Charles J. Fassbender; Kevin R. Peterson

[57] ABSTRACT

A bubble memory comprises a substrate with a major surface; a first storage module for storing bubbles on the left side of the surface having parallel inputs and parallel outputs; a second storage module for storing bubbles on the right side of the surface having parallel inputs and parallel outputs; a first input circuit on the left side of the surface including a serial-parallel track along which the bubbles move to the right to enter the parallel inputs of the first storage module; a second input circuit on the right side of the surface including a serial-parallel track along which the bubbles move to the left to enter the parallel inputs of the second storage module; a detector for detecting bubbles disposed equally on the left side and the right side of the surface; a first output circuit on the left side of the surface including a parallel-serial track which receives bubbles from the parallel outputs of the first storage module and moves them to the right to the detector; and a second output circuit on the right side of the surface including a parallel-serial track which receives bubbles from the parallel outputs of the second storage module and moves them to the left to the detector.

8 Claims, 5 Drawing Figures

BUBBLE MEMORY WHICH TRANSFERS BUBBLES IN BOTH RIGHT-TO-LEFT AND LEFT-TO-RIGHT SPS LOOPS TO PROVIDE A SHORT ACCESS TIME

BACKGROUND OF THE INVENTION

This invention relates to magnetic bubble memories; and in particular, it relates to architectures for such memories that reduce both the space which they occupy and the speed at which they are read.

In the prior art, a dilemma existed in that a bubble memory that had a relatively fast access time required a relatively large amount of space; and conversely, a bubble memory that occupied only a relatively small amount of space had a relatively slow access time. This is evident by inspection of the bubble memory architectures of FIGS. 1 and 2.

Included in the FIG. 1 memory is a substrate 10, a set of storage loops 11 on the left side of substrate 10; and another set of storage loops 12 on the right side of substrate 10. Bubbles representing the even-numbered bits of a serial data stream are generated by a generator 13. Those bubbles are written into the storage loops 11 by means of a serial-parallel input mechanism 14 on the left side of substrate 10 which moves the bubbles from right to left along a serial path so that they line up with the loops 11.

Similarly, bubbles representing the odd-numbered bits of the above-mentioned serial data stream are generated by a generator 15. Those bubbles are written into the storage loops 12 by another serial-parallel input mechanism 16 on the right side of substrate 10 which also moves bubbles from right to left along a serial path so they align with the inputs to the loops 12.

Bubbles are read from the storage loops 11 by means of an output mechanism 17. It includes a parallel-serial path on the left side of substrate 10 along which bubbles move from right to left into a detector 18. At the same time, bubbles are read from storage loops 12 by means of an output mechanism 19. It includes a parallel-serial path on the right side of substrate 10 along which bubbles move from right to left into detector 18.

In the FIG. 1 memory, those portions of the output mechanisms 17 and 19 which lie between detector 18 and the closest storage loops are made as short as possible. This is highly desirable since it minimizes the time which is required to read bubbles from the storage loops. But since such portion of mechanism 17 is so short, bubbles from mechanism 17 are forced to enter detector 18 at its left end.

Those bubbles which are received in detector 18 are first stretched all the way from the left end of the detector to the right end. Typically, this stretching operation is achieved by multiple rows of symmetric chevrons in detector 18, with each row extending all the way across the detector. Only after the bubbles are stretched in size can they be detected.

Since bubbles from output mechanism 17 enter detector 18 at the left end, those bubbles are stretched only towards the right. Thus, the total number of stretching elements in detector 18 must be increased over that which would be required if the bubbles were able to stretch in both directions; and that makes the memory relatively large.

In the FIG. 2 memory, components 10–16 are the same as described above; but modified output mechanisms 17' and 19' are provided which route the bubbles from storage loops 11 and 12 to a modified detector 18' at its center. Thus the bubbles from output mechanisms 17' and 19' can stretch in both the left and right directions; and so the number of stretching elements required in detector 18' is substantially less than those in detector 18.

However, routing the bubbles from the storage loops 11 to the center of detector 18' increases the length of the serial path in output mechanism 17'. This in turn increases the length of the serial path in output mechanism 19' since it must be the same length as detector 17' if the even and odd bubbles in storage loops 11 and 12 are to reach detector 18' in synchronization. Consequently, the time required to read bubbles from the storage loops 10 and 12 is relatively long.

BRIEF SUMMARY OF THE INVENTION

Accordingly, a primary object of the invention is to provide an improved bubble memory architecture which occupies a reduced amount of space and also has a reduced access time.

This object and others are achieved according to the present invention by a bubble memory comprised of a subtrate with a major surface, a first storage means for storing bubbles on the left side of the surface having left to right oriented parallel outputs, a second storage means for storing bubbles on the right side of the surface having right to left oriented parallel outputs, a means for detecting bubbles disposed equally on the left side and the right side of the surface, a first output means on the left side of the surface including a parallel-serial track which receives bubbles from the parallel outputs of the first storage means and moves them to the right to said detector in response to a rotating magnetic field, and a second output means on the right side of the surface including a parallel-serial track which receives bubbles from the parallel outputs of the second storage means and moves them to the left to the detector in response to the rotating field.

Preferably, the first and second parallel-serial tracks enter the detector at the center of the major surface. This enables the total number of chevrons in each of the parallel-serial tracks between the detector and the closest output of the storage means is less than five.

Also preferably, the first storage means has left to right oriented parallel inputs, the second storage means has right to left oriented parallel inputs, a first input means is provided on the left side of the surface and includes a serial-parallel track along which bubbles move to the right in response to the rotating field to enter the parallel inputs of the first storage means, and a second input means is located on the right side of the surface and includes a serial-parallel track along which bubbles move to the left in response to the rotating field to enter the parallel inputs of the second storage means.

BRIEF DESCRIPTION OF THE DRAWINGS

Various details of the invention are described in the Detailed Description in conjunction with the accompanying drawings wherein.

DETAILED DESCRIPTION OF THE INVENTION

Figure 1:
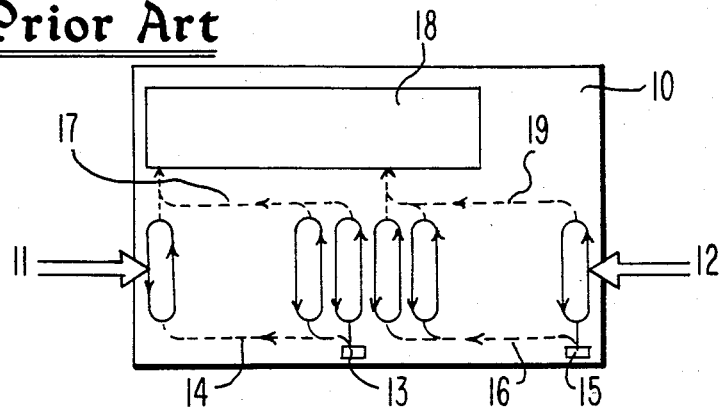
FIG. 1 illustrates a prior art architecture for a bubble memory.

One preferred embodiment of the invention will now be described in detail, beginning with FIG. 3. This embodiment includes a substrate 30 having a major surface; a set of storage loops 31 for storing bubbles on the left side of substrate 30; and another set of storage loops 32 for storing bubbles on the right side of substrate 30. Both sets of storage loops 31 and 32 have parallel inputs at their bottom and have parallel outputs at their top.

Magnetic bubbles representing even-numbered bits of a serial data stream are generated by a generator 33 which is disposed on the lower left corner of substrate 30. Those bubbles are then moved to the right along a serial-parallel track 34 to enter the parallel inputs of the storage loops 31. Another bubble generator 35 is disposed on the lower right corner of substrate 30; and it generates bubbles which represent the odd-numbered bits of the above-mentioned serial data stream. Bubbles from generator 35 are then moved to the left along a serial-parallel track 36 to enter the parallel inputs of the storage loops 32.

A bubble detector 38 is disposed equally on the upper left and the upper right of substrate 30. Included within detector 38 are multiple rows of symmetric chevrons with each row extending all the way from the left side of the detector to the right side. These chevrons operate to stretch bubbles prior to their actual detection.

An output mechanism 37 for the storage loops 31 is disposed on the upper left side of substrate 30. It includes a parallel-serial track which receives bubbles from the parallel outputs of the storage loops 31 and moves them to the right to detector 38. Another output mechanism 39 is disposed on the upper right side of substrate 30. It includes a parallel-serial track which receives bubbles from the parallel outputs of the storage loops 32 and moves them to the left to detector 38.

Figure 3:
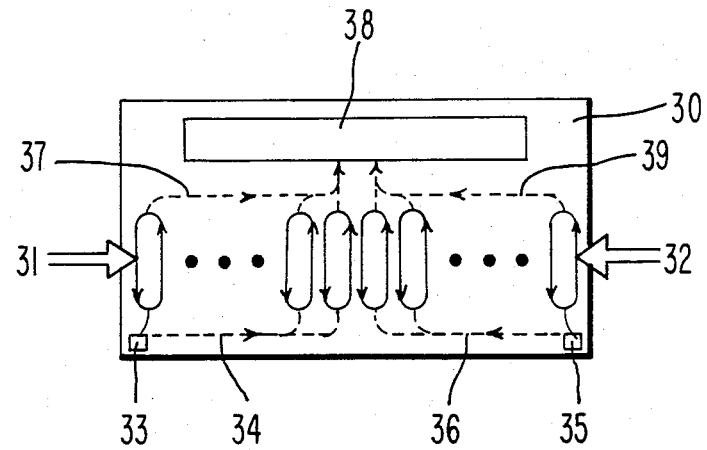
FIG. 3 illustrates a preferred architecture for a bubble memory constructed according to the invention.

All of the above-described directions in which the bubbles move are indicated in FIG. 3 by various arrowheads. They show that bubbles from generator 33 first move to the right along the serial-parallel path 34; from there the bubbles move counterclockwise in the storage loops 31; and from there the bubbles move to the right along the parallel-serial path 37 to the center of detector 38. By comparison, bubbles from generator 35 move to the left along the serial-parallel path 36; from there they move counterclockwise in the storage loops 32; and from there they move to the left along the parallel-serial path 39 to the center of detector 38.

Figure 2:
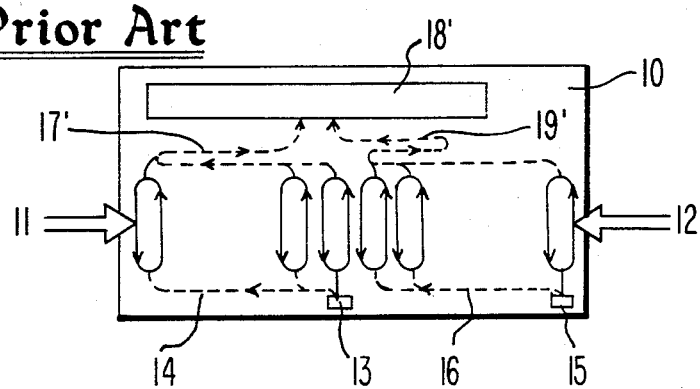
FIG. 2 illustrates another prior art architecture for a bubble memory.

A primary feature of the FIG. 3 memory is that the portion of the parallel-serial paths 37 and 39 which lie between detector 38 and the closest storage loops is very short. Thus, the time that it takes to read bubbles from the storage loops is small in comparison to the previously described FIG. 2 memory. Further, bubbles from both of the parallel-serial paths 37 and 39 enter detector 38 at its center. Thus, those bubbles get stretched in both the left and right directions; and so the total number of stretchers in detector 38 is small in comparison to the previously described FIG. 1 memory.

Figure 4:
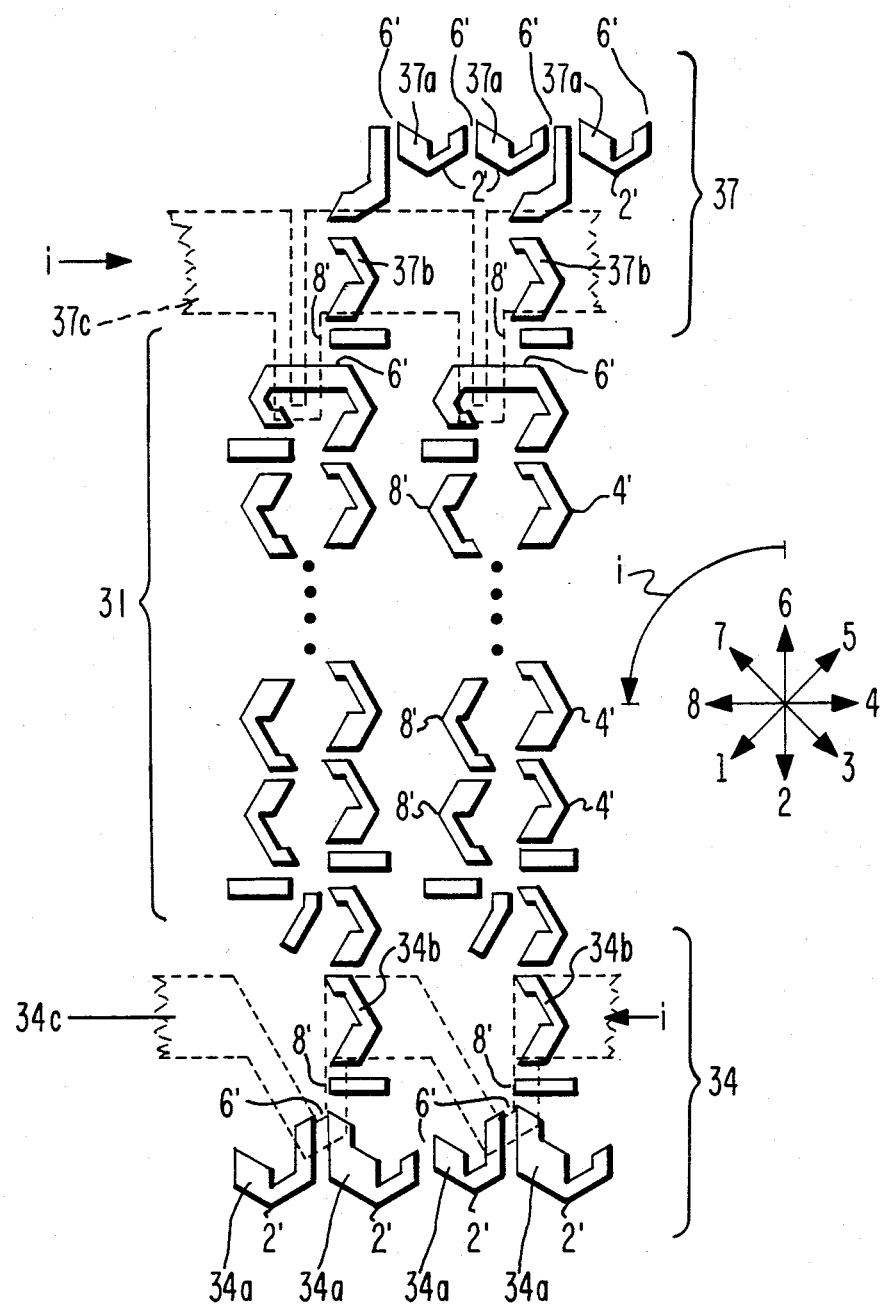
FIG. 4 illustrates structural details of the left half of the memory of FIG. 3.

Referring now to FIG. 4, a preferred physical structure for input mechanism 34 will be described. As there illustrated, input mechanism 34 includes a serial-parallel string of asymmetric chevrons, with chevrons 34a making up the serial portion of the string and chevrons 34b making up the parallel portions. These chevrons are asymmetric in that they each have one relatively wide leg and one relatively narrow leg.

Each of the chevrons 34a have both of their legs pointing towards the storage loops 31 and have their wide leg on the left. Also, each of the chevrons 34b have both of their legs pointing to the left and have their wide leg pointing to the chevrons 34a.

An electrical conductor 34c is further included in the input mechanism 34. Conductor 34c runs parallel to the serial chevrons 34a on the side to which those chevron legs point. Specifically, conductor 34c crosses the parallel chevrons 34b; and then immediately after each crossing it makes a hairpin turn to loop around the end of the legs of the serial chevrons 34a which lie next to the parallel chevrons 34b.

In FIG. 4, reference numerals 1 through 8 indicate various directions of a counterclockwise rotating magnetic field which moves the bubbles through the input mechanism 34. Also in FIG. 4, those same reference numerals with a prime indicate the corresponding positions of the bubbles as they move along the chevrons 34a and 34b. For example, the bubbles are at position 2′ when the field points in direction 2; the bubbles are at position 6′ when the field points in direction 6; etc.

To transfer bubbles from the serial chevrons 34a to the parallel chevrons 34b, a current "i" is passed through conductor 34c. Bubbles are attracted by a magnetic field that points in the same direction as the field from the bubbles themselves; so if the field from the bubbles points into the plane of FIG. 4, the current "i" must flow through conductor 34c in a right to left direction.

Current "i" must start flowing through conductor 34c when the field points in direction 6 and must stop flowing when the field points in direction 8. This is because when the field points in direction 6, the bubbles are at the ends of the chevron legs 34a which conductor 34c loops around. Consequently, the megnetic field which current "i" generates operates to trap the bubbles within the current hairpin loop of conductor 34c, and so the bubbles can only move upward along the parallel chevrons 34b.

Figure 5:
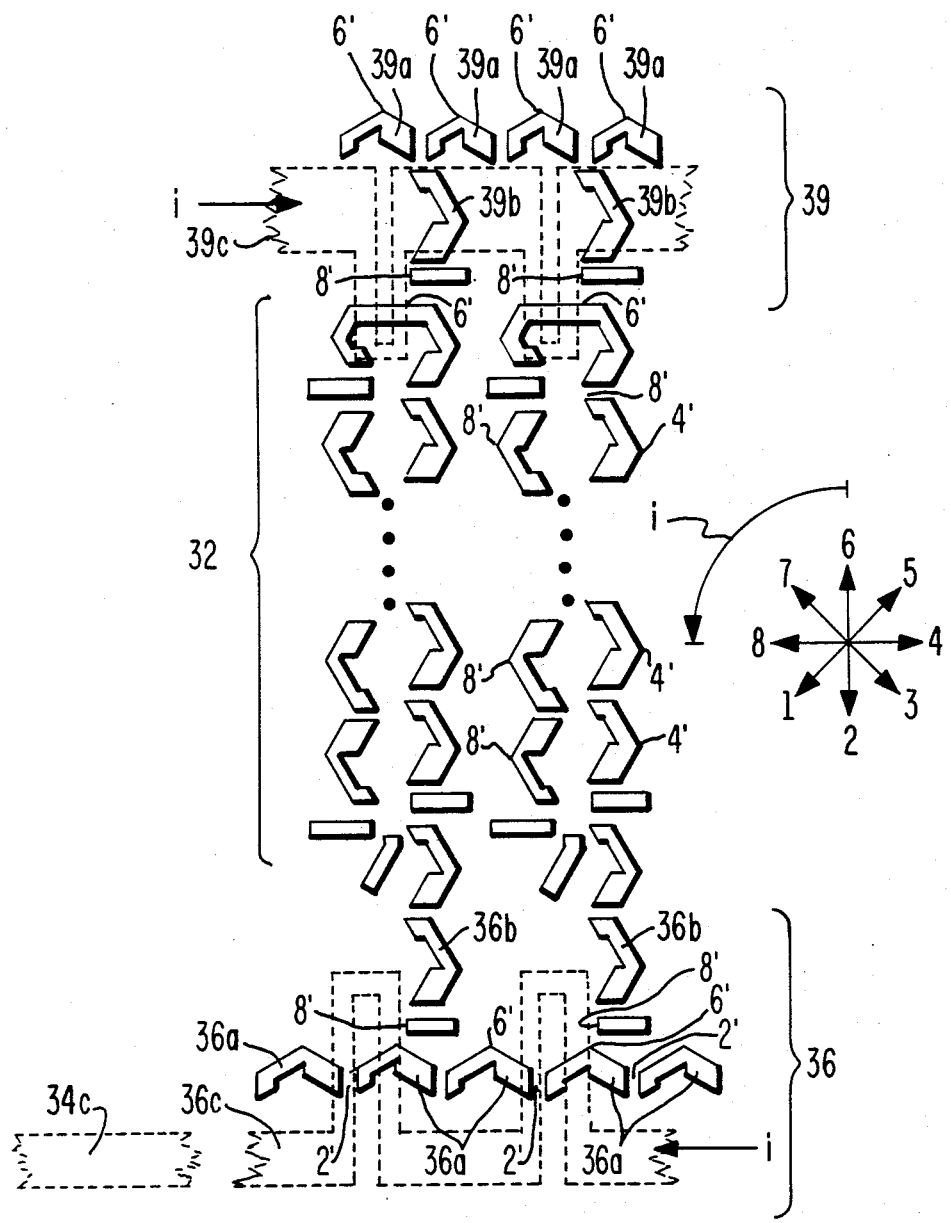
FIG. 5 illustrates structural details of the right half of the memory in FIG. 3.

Consider next the structure of the other input mechanism 36 as illustrated in FIG. 5. It is comprised of a plurality of asymmetric chevrons which are disposed along a serial-parallel path with chevrons 36a making up the serial portion of the path and chevrons 36b making up the parallel portion. Also, a conductor 36c is included which carries a current "i" that directs the bubbles from the serial portion of the path to the parallel portion.

But in input mechanism 36, the legs of the chevrons 36a point away from the storage loops 32; the relatively wide leg of each chevron 36a is on the right; and conductor 36c doesn't cross any of the parallel chevrons 36b. Instead, conductor 36c runs alongside of the chevrons 36a on the side opposite to that on which the chevrons 36b lie; and it makes hairpin turns completely across the serial-chevrons 36a at the point where they are met by the parallel chevrons 36b. None of these structural features exist in input mechanism 34.

In FIG. 5, reference numerals 1 through 8 again indicate various directions of a counterclockwise rotating magnetic field which moves bubbles through input mechanism 36; and those same reference numerals with a prime again indicate the position of the bubbles which correspond to the field directions.

To transfer the bubbles from the serial chevrons 36a to the parallel chevrons 36b, a current "i" is sent through conductor 36c. This current is sent through the conductor in a right to left direction; and it is sent while the field points in directions 6, 7, and 8. Such a current flow generates a magnetic field which blocks the bubbles from moving along the chevrons 36a at the point where the two legs of each chevron join together. Consequently, the blocked bubbles move up the parallel chevrons 36b.

Recall that the current "i" in conductor 34c was also sent through that conductor when the field pointed in directions 6, 7, and 8. Thus, conductors 34c and 36c preferably join together at the center of substrate 30; and terminals are provided at the only two remaining unconnected ends of those conductors 34c and 36c to send the current "i" through them at the same time.

Consider next the structure of the storage loops 31 and 32 as illustrated in FIGS. 4 and 5. Those storage loops 31 and 32 are identical to each other, with each loop simply being comprised of a plurality of asymmetric chevrons which lie end to end around the loop. For each rotation of the counterclockwise rotating magnetic field, a bubble moves from one chevron to the next; and so the total number of bubbles that is stored per loop is equal to the total number of chevrons per loop.

Next, consider the structural details of output mechanism 37 as illustrated in FIG. 4. It includes a plurality of asymmetric chevrons which lie along a parallel-serial path, with chevrons 37a comprising the serial portion of the path and chevrons 37b comprising the parallel portions of the path. Each of the chevrons 37a have both of their legs pointing away from the storage loops 31 and have their wide leg on the left; while each of the chevrons 37b have both of their legs pointing to the left and have their wide leg pointing towards the storage loops 31.

Also included in output mechanism 37 is a conductor 37c which runs parallel to the chevrons 37a. Specifically, conductor 37c crosses each of the parallel path chevrons 37b; and then it makes a series of hairpin turns into the storage loops 31.

By sending current through conductor 37c in a left to right direction when the rotating field is pointing in position 6, 7, and 8, bubbles are transferred from the storage loops 31 to the parallel chevrons 37b. Those bubbles then move from the parallel chevrons 37b along the serial chevrons 37a to detector 38 in response to the rotating magnetic field as indicated by the reference numerals 1' through 8'.

Finally, consider the structural details of output mechanism 39 as illustrated in FIG. 5. It includes a plurality of asymmetric chevrons which lie along a parallel-serial path, with the chevrons 39a comprising the serial portion of the path and the chevrons 39b comprising the parallel portion of the path. Each of the chevrons 39a have both of their legs pointing towards the storage loops 32 and have their wide leg on the right; while each of the chevrons 39b have both of their legs pointing to the right and have their wide leg pointing towards the storage loops 32.

Also included in output mechanism 39 is a conductor 39c which runs parallel to the chevrons 39a. Specifically, conductor 39c crosses each of the parallel path chevrons 39b; and then it makes a series of hairpin turns into the storage loops 32. To transfer bubbles from the storage loops to output mechanism 39, current is sent through conductor 37c in a left to right direction when the rotating field points in directions 6, 7, and 8. This is the same time that current is sent through conductor 37c. So conductors 37c and 39c preferably are joined together at the center of the substrate; and terminals are provided at the remaining ends of those conductors to send current through them at the same time.

One preferred embodiment of the invention has now been described in detail. In addition, however, many changes and modifications can be made to these details without departing from the nature and the spirit of the invention. Accordingly, it is to be understood that the invention is not limited to said details but is defined by the appended claims.

What is claimed is:

1. A bubble memory comprised of: a substrate with a major surface; a first storage means for storing bubbles on the left side of said surface having parallel inputs and parallel outputs; a second storage means for storing bubbles on the right side of said surface having parallel inputs and parallel outputs; a first input means on the left side of said surface including a serial-parallel track along which said bubbles move to the right immediately before they enter said parallel inputs of said first storage means; a second input means on the right side of said surface including a serial-parallel track along which said bubbles move to the left immediately before they enter said parallel inputs of said second storage means; a means for detecting bubbles disposed equally on the left side and the right side of said surface; a first output means on the left side of said surface including a parallel-serial track which receives bubbles from said parallel outputs of said first storage means and immediately moves them to the right to said detector; and a second output means on the right side of said surface including a parallel-serial track which receives bubbles from said parallel outputs of said second storage means and immediately moves them to the left to said detector.

2. A memory according to claim 1 wherein said first input means includes a serial-parallel string of asymmetric chevrons with the chevron legs in the serial portion of said string pointing towards said first storage means, and an electrical conductor which runs parallel to said serial portion on the side to which said legs point and makes a series of hairpin turns to loop around the end of those legs of the chevrons in the serial portion of said string which lie next to the parallel portions.

3. A memory according to claim 2 wherein said second input means includes a serial-parallel string of asymmetric chevrons with the chevron legs in the serial portion which point away from said second storage means, and an electrical conductor which runs parallel to said serial portion on the side to which said legs point and makes a series of hairpin turns which cross the serial portion and run alongside of the parallel portions of said string.

4. A memory according to claim 3 wherein said conductor in said first input means connects at the center of said surface to said conductor in said second input means and terminals are provided at only the two remaining unconnected ends of said conductor to send current therethrough.

5. A memory according to claim 4 wherein said first and second parallel-serial tracks enter said detector at the center of said surface.

6. A memory according to claim 5 wherein the total number of chevrons in each of said parallel-serial tracks between said detector and the closest output of said storage means is less than five.

7. A memory according to claim 6 wherein said first and second storage means are each comprised of a plurality of closed loops of asymmetric chevrons.

8. A bubble memory comprised of: a substrate with a major surface; a first storage means for storing bubbles on the left side of said surface having left to right oriented parallel inputs; a second storage means for storing bubbles on the right side of said surface having right to left oriented parallel inputs; a first input means on the left side of said surface including a serial-parallel track along which said bubbles move to the right in response to a rotating magnetic field immediately before they enter said parallel inputs of said first storage means; and a second input means on the right side of said surface including a serial-parallel track along which said bubbles move to the left in response to said field immediately before they enter said parallel inputs of said second storage means.

* * * * *